United States Patent [19]
Lin

[11] Patent Number: 5,708,564
[45] Date of Patent: Jan. 13, 1998

[54] HEAT SINK MOUNTING STRUCTURE

[76] Inventor: Andy Lin, 15 Fl., No. 49, Nan-Hwa Rd., Chung-Ho, Taipei Hsien, Taiwan

[21] Appl. No.: 646,013

[22] Filed: May 7, 1996

[51] Int. Cl.⁶ .................................................. H05K 7/20
[52] U.S. Cl. .................. 361/704; 165/80.2; 165/80.3; 165/185; 174/16.3; 257/707; 257/713; 257/718; 361/697; 361/710; 361/717; 361/722
[58] Field of Search .................. 165/80.2, 80.3, 165/185; 174/16.3; 257/706, 707, 712–713, 718–719; 361/694–695, 704, 707, 709–710, 715, 717–719, 722

[56] References Cited

U.S. PATENT DOCUMENTS

| | | | |
|---|---|---|---|
| 4,345,267 | 8/1982 | Corman et al. | 361/710 |
| 4,607,685 | 8/1986 | Mitchell, Jr. | 165/80.3 |
| 4,745,456 | 5/1988 | Clemens | 257/718 |
| 5,375,652 | 12/1994 | Matsunaga et al. | 165/80.3 |
| 5,392,193 | 2/1995 | Robertson, Jr. et al. | 361/710 |
| 5,397,919 | 3/1995 | Tata et al. | 257/717 |
| 5,463,529 | 10/1995 | Chia et al. | 361/704 |
| 5,495,392 | 2/1996 | Shen | 361/697 |
| 5,566,052 | 10/1996 | Hughes | 361/704 |
| 5,596,485 | 1/1997 | Glenn et al. | 361/719 |

*Primary Examiner*—Gregory D. Thompson
*Attorney, Agent, or Firm*—Bacon & Thomas

[57] ABSTRACT

A heat sink mounting structure including a mounting frame fastened to a CPU holder above a CPU in the CPU holder, and a heat sink fastened to the mounting frame and disposed in contact with the CPU to dissipate heat from it, the CPU holder having two retainer rods adapted for securing the mounting frame in place, wherein the mounting frame comprises an annular bearing portion suspended on the inside and adapted to hold the heat sink, the annular bearing portion having a plurality of retaining notches and a plurality of sliding grooves respectively extending from the retaining notches; the heat sink includes a plurality of projecting locating elements projecting outwards from the periphery, the projecting locating elements being moved along the sliding grooves into engagement with the retaining notches when the heat sink is mounted on the annular bearing portion.

5 Claims, 3 Drawing Sheets

HEAT SINK MOUNTING STRUCTURE

BACKGROUND OF THE INVENTION

The present invention relates to a heat sink mounting structure adapted for fastening to a CPU holder to hold a heat sink in contact with the CPU (central processing unit) in the CPU holder, permitting heat to be quickly carried away from the CPU.

The CPU of a computer system is the operation center, which releases heat during its operation. Heat dissipating means is needed to carry heat away from the CPU during the operation of the computer system so that the operation of the CPU can be maintained normal, and the service life of the CPU can be prolonged. Various heat dissipating devices have been developed for this purpose. Exemplars are seen in U.S. Pat. No. 5,313,099, entitled "HEAT SINK ASSEMBLY FOR SOLID STATE DEVICES"; U.S. Pat. No. 4,745,456, entitled "HEAT SINK CLIP ASSEMBLY"; U.S. Pat. No. 4,607,685 entitled "HEAT SINK FOR INTEGRATED CIRCUIT PACKAGE". The heat sink assembly for solid state devices according to U.S. Pat. No. 5,313,099 comprises a threaded base of a finned heat sink adapted to be received in a threaded bore of an adapter which mounts onto an electronic device package. Desired thermal coupling is achieved by screwing down the heat sink in biasing engagement with the packet. However, during the installation of the heat sink, the electronic device package may be damaged. The heat sink clip assembly of U.S. Pat. No. 4,745,456 comprises a frame and a clip for securing and aligning a heat sink with an electronic device package. However, because the CPU must be dismounted when the heat sink clip assembly is used, the contacts of the CPU tend to be deformed or damaged. The heat sink for integrated circuit package of U.S. Pat. No. 4,607,685 which comprises a snap-on holding piece that permits a finned cooling unit to be threaded through an aluminum base plate attached to the pin grid array package so that a threaded shaft of the cooling unit may be screwed into adjustable contact with a disk mounted on the integrated circuit package. This finned cooling unit mounting structure is complicated to install. During the installation of the snap-on holding piece, the pin grid array package tends to be damaged.

SUMMARY OF THE INVENTION

It is one object of the present invention to provide a heat sink which can be quickly installed and firmly maintained in contact with the CPU. It is another object of the present invention to provide a mounting frame which can be quickly fastened to the CPU holder to hold the heat sink into contact with the CPU without causing the CPU holder to be damaged.

DETAILED DESCRIPTION OF THE PREFERRED EMBODIMENT

Figure 1:
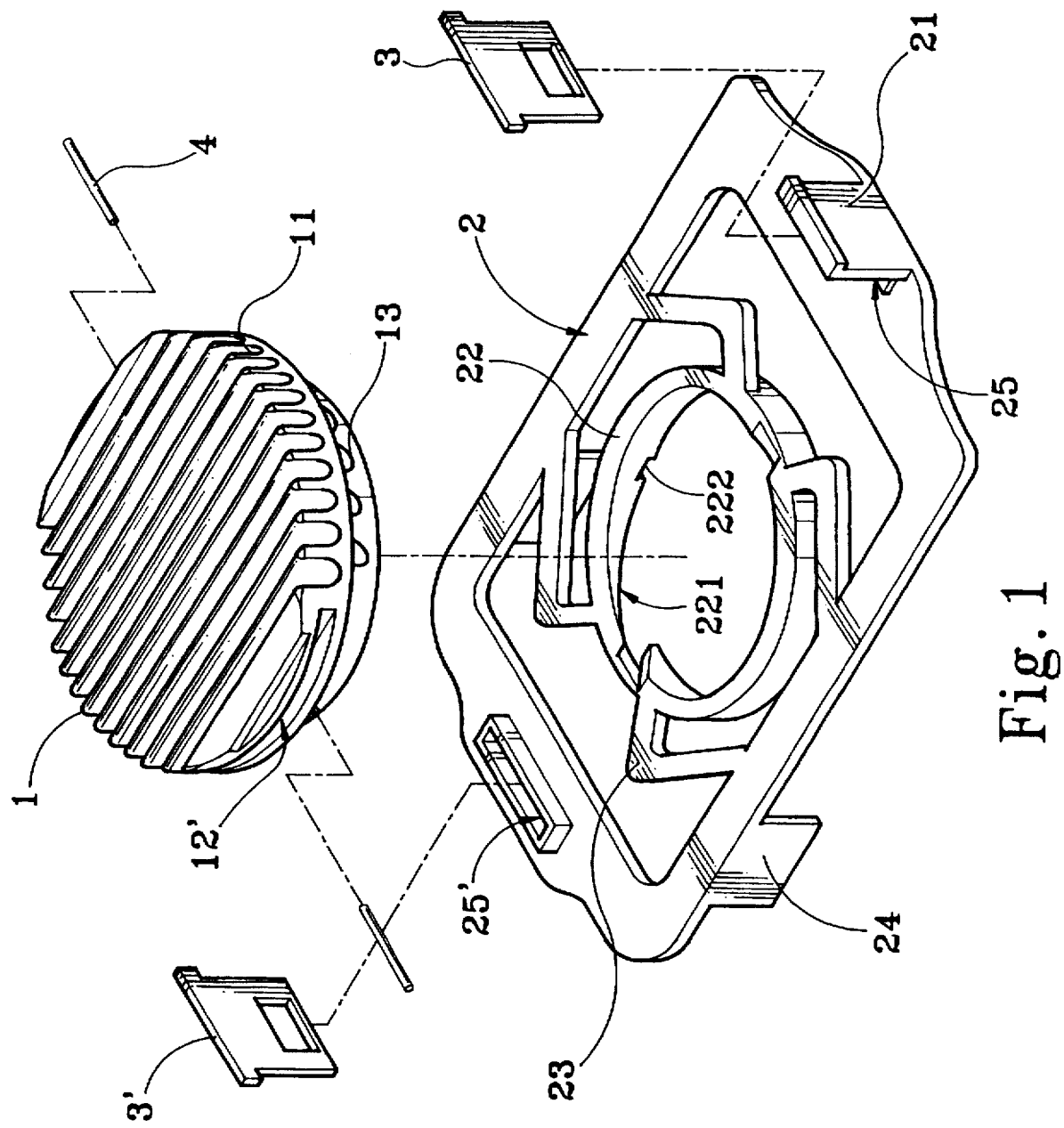
FIG. 1 is an exploded view of a heat sink mounting structure according to the present invention.

Referring to FIG. 1, a heat sink mounting structure in accordance with the present invention is generally comprised of a heat sink 1, and a mounting frame 2. The heat sink 1 comprises a plurality of upright radiating fins 11 raised from the top side and adapted for dissipating heat, two mounting grooves 12, 12' at two opposite sides adapted for the installation of a fan, a plurality of air vents 13 at the bottom, two blind holes 14, 14' at two opposite sides near the bottom, and two finger devices for example locating pins 4 respectively fastened to the blind holes 14, 14' and projecting out of the periphery of the heat sink 1 and adapted for sliding along respective sliding grooves 221 on the mounting frame 2 into engagement with respective retaining notches 222 at the bottom side of the mounting frame 2.

Figure 2:
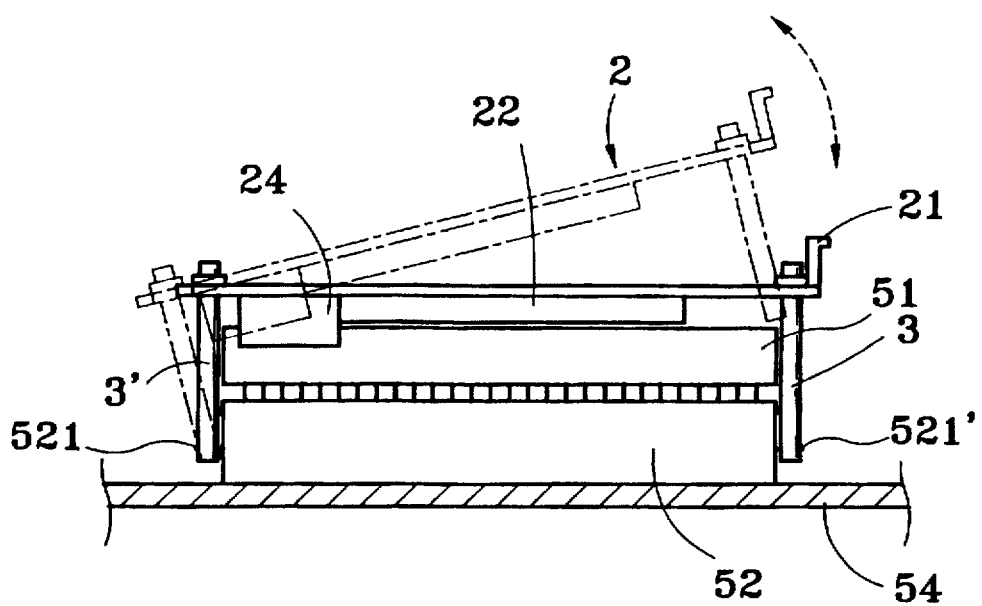
FIG. 2 shows the installation of the mounting frame in the CPU holder according to the present invention.
Figure 3:
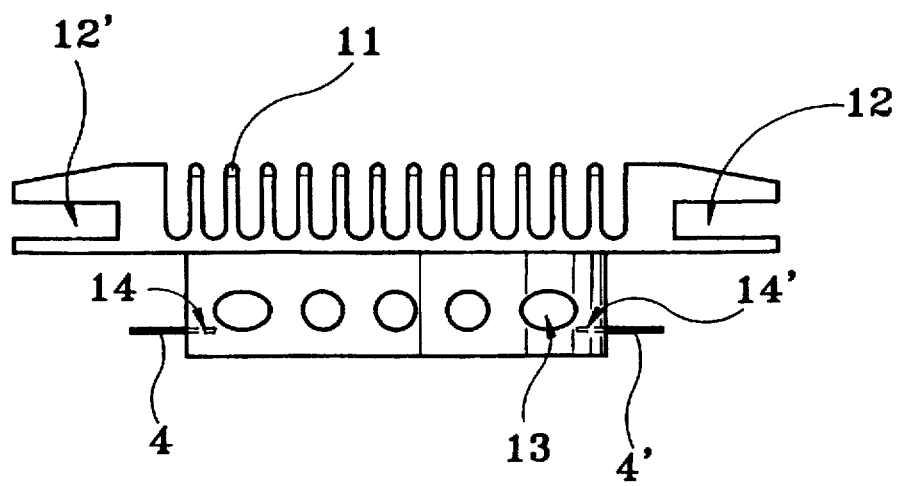
FIG. 3 is a side view of the heat sink according to the present invention.

Referring to FIG. 2 and FIG. 1 again, the mounting frame 2 is adapted for fastening to a CPU holder 52, comprising an annular bearing portion 22 connected to the periphery thereof by springy suspension ribs 23 and adapted for holding the heat sink 1. The annular bearing portion 22 has two retaining notches 222 at the bottom side adapted for engaging the locating pins 4 of the heat sink 1, and two sliding grooves 221 radially extending from the retaining notches 222 in reversed directions. The CPU holder 52 is welded to a circuit board 54 to hold a CPU 51, having two retainer rods 521, 521' adapted for retaining the mounting frame 2 in place. Two striking plates 3, 3' are respectively mounted in respectively holes 25, 25' in the mounting frame 2 and fastened to the retainer rods 521, 521' of the CPU holder 52 to secure the mounting frame 2 to the CPU holder 52. A finger strip 21 is raised from mounting frame 2 adjacent to one through hole 25. By bending the finger strip 21 outwards to deform the mounting frame 2 (the mounting frame 2 is made from resilient material, therefore it is bendable), the striking plates 3, 3' can be conveniently removed from the holes 25, 25' of the mounting frame 2, permitting the mounting frame 2 to be disconnected from the CPU holder 52. The mounting frame 2 further has at least two downward stop plates 24 at two opposite sides adapted for abutting against two opposite sides of the CPU holder 52.

Figure 4:
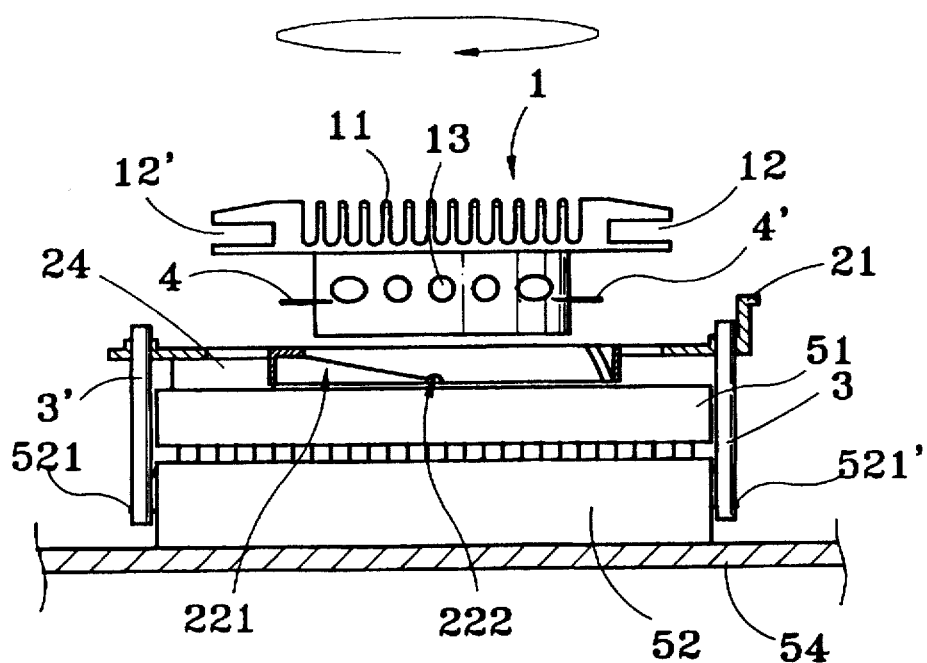
FIG. 4 shows the installation of the heat sink in the mounting frame according to the present invention.
Figure 5:
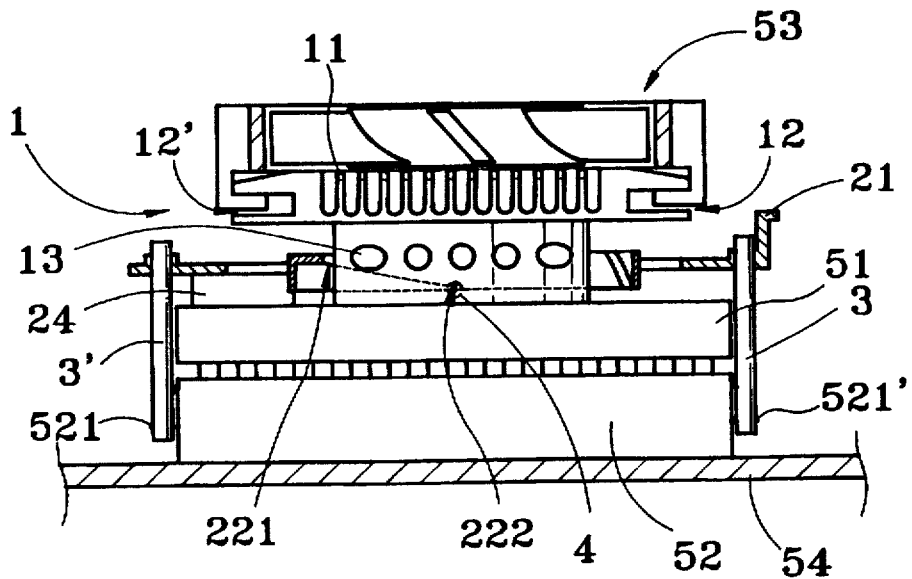
FIG. 5 shows the heat sink installed in the mounting frame according to the present invention.

Referring to FIGS. 4 and 5, when the mounting frame 2 is installed in the CPU holder 52, the heat sink 1 is mounted on the annular bearing portion 22 of the mounting frame 2 and then rotated to move the locating pins 4 along the sliding grooves 221 into engagement with the retaining notches 222. Because the annular bearing portion 22 is suspended from the ribs 23, it can be slightly deformed to let the heat sink 1 to be forced into position. When the heat sink 1 installed, the springy power of the annular bearing portion 22 immediately forces the annular bearing portion 22 returns to its former shape, and therefore the heat sink 1 is firmly retained in contact with the CPU 51 by the annular bearing portion 22, permitting heat to be quickly transmitted from the CPU 51 to the heat sink 1 and then dissipated into the air. Furthermore, a fan may be mounted on the heat sink 1 and secured to the mounting groove 12, 12' so that heat can be quickly carried away from the heat sink 1 by currents of air produced by the fan.

While only one embodiment of the present invention has been shown and described, it will be understood that various modifications and changes could be made without departing from the spirit and scope of the invention disclosed.

I claim:

1. A heat sink mounting structure of the type comprising a mounting frame fastened to a CPU holder above a CPU in said CPU holder, and a heat sink fastened to said mounting frame and disposed in contact with said CPU to dissipate heat from it, said CPU holder having two retainer rods adapted for securing said mounting frame in place, wherein said mounting frame comprises an annular bearing portion suspended on the inside and adapted to hold said heat sink, said annular bearing portion having a plurality of retaining notches and a plurality of sliding grooves respectively and radially extending from said retaining notches; said heat sink comprises a plurality of projecting locating means projecting outwards from the periphery, said projecting locating means being moved along said sliding grooves into engagement with said retaining notches when said heat sink is mounted on said annular bearing portion.

2. The heat sink mounting structure of claim 1 wherein said mounting frame further comprises two through holes near two opposite ends, and two striking plates respectively mounted in said through holes and forced into engagement with the retainer rods of said CPU holder.

3. The heat sink mounting structure of claim 2 wherein said mounting frame further comprises a finger strip disposed adjacent to one through hole and adapted for bending by the hand to deform said mounting frame, permitting said striking plates to be disconnected from the retainer rods of said CPU holder.

4. The heat sink mounting structure of claim 1 wherein each of said projecting locating means comprises a blind hole in the periphery of said heat sink, and a locating pin fastened to said blind hole.

5. The heat sink mounting structure of claim 1 wherein said annular bearing portion are connected to the periphery of said mounting frame by springy suspension ribs.

* * * * *